United States Patent
Yamamoto

(10) Patent No.: US 12,407,316 B2
(45) Date of Patent: Sep. 2, 2025

(54) MULTILAYERED FILTER DEVICE

(71) Applicant: TDK CORPORATION, Tokyo (JP)

(72) Inventor: Arata Yamamoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 238 days.

(21) Appl. No.: 18/179,600

(22) Filed: Mar. 7, 2023

(65) Prior Publication Data

US 2023/0327631 A1 Oct. 12, 2023

(30) Foreign Application Priority Data

Mar. 24, 2022 (JP) .................................. 2022-047842

(51) Int. Cl.
*H03H 7/01* (2006.01)
*H03H 7/09* (2006.01)
*H03H 1/00* (2006.01)

(52) U.S. Cl.
CPC ............ *H03H 7/0115* (2013.01); *H03H 7/09* (2013.01); *H03H 7/1791* (2013.01); *H03H 2001/0085* (2013.01)

(58) Field of Classification Search
CPC . H03H 2001/0085; H03H 7/0115; H03H 7/09
USPC .................................................. 333/175, 185
See application file for complete search history.

(56) References Cited

U.S. PATENT DOCUMENTS

| | | |
|---|---|---|
| 2009/0034504 A1 | 2/2009 | Uejima |
| 2010/0171568 A1* | 7/2010 | Taniguchi ................ H03H 7/09 333/176 |
| 2013/0154769 A1 | 6/2013 | Masuda |
| 2015/0028969 A1 | 1/2015 | Watanabe |
| 2017/0093358 A1* | 3/2017 | Imamura .................. H03H 7/09 |
| 2018/0145651 A1* | 5/2018 | Kitami ..................... H03H 1/00 |
| 2018/0316330 A1 | 11/2018 | Kitami et al. |
| 2023/0188111 A1 | 6/2023 | Ogawa |

FOREIGN PATENT DOCUMENTS

| | | |
|---|---|---|
| JP | 2018-186417 | 11/2018 |
| TW | I508440 B | 11/2015 |
| WO | 2008/088040 | 7/2008 |
| WO | 2022/071191 | 4/2022 |

OTHER PUBLICATIONS

Translation of Jun. 17, 2025 Office Action issued in Japanese Application No. 2022-047842.

* cited by examiner

*Primary Examiner* — Rakesh B Patel
(74) *Attorney, Agent, or Firm* — Oliff PLC

(57) ABSTRACT

A multilayered filter device includes a first port, a second port, a first LC resonator electrically connected to the first port, a second LC resonator electrically connected to the second port, a third LC resonator provided between the first LC resonator and the second LC resonator in a circuit configuration, and a stack. The first LC resonator includes a first inductor. The second LC resonator includes a second inductor. The first inductor and the second inductor are configured to be magnetically coupled inside the stack.

10 Claims, 13 Drawing Sheets

MULTILAYERED FILTER DEVICE

CROSS REFERENCE TO RELATED APPLICATIONS

This application claims the benefit of Japanese Priority Patent Application No. 2022-047842 filed on Mar. 24, 2022, the entire contents of which are incorporated herein by reference.

BACKGROUND OF THE INVENTION

1. Field of the Invention

The present invention relates to a multilayered filter device including an LC resonator.

2. Description of the Related Art

One of electronic components used in a communication apparatus is a band-pass filter including a plurality of resonators. Each of the resonators is an LC resonator composed of an inductor and a capacitor, for example.

A band-pass filter that is used for a small-sized communication apparatus in particular is required to be downsized. One known example of a band-pass filter suitable for downsizing is a band-pass filter using a stack including a plurality of insulating layers and a plurality of conductor layers stacked together.

US 2015/0028969 A1 discloses a band-pass filter including a stack constituted by stacking a plurality of dielectric layers. This band-pass filter includes a plurality of parallel resonant circuits composed of inductors and capacitors.

One of favorable characteristics of a band-pass filter is that insertion loss changes sharply at a frequency range near a cut-off frequency. Such a characteristic can be implemented, for example, by generating an attenuation pole at the frequency range near the cut-off frequency in the pass characteristic of the band-pass filter.

Attenuation poles can typically be adjusted using the resonant frequencies of resonators. However, LC resonators have the problem that the characteristic of changing sharply in attenuation near an attenuation pole is difficult to implement. For such a reason, it has heretofore been difficult to generate an attenuation pole at a frequency range near a cut-off frequency while maintaining a desirable pass characteristic in the passband.

SUMMARY OF THE INVENTION

An object of the present invention is to provide a multilayered filter device including an LC resonator, and having a pass characteristic that changes sharply at a frequency range near a cut-off frequency.

A multilayered filter device according to the present invention includes a first port, a second port, a first LC resonator electrically connected to the first port, a second LC resonator electrically connected to the second port, a third LC resonator provided between the first LC resonator and the second LC resonator in a circuit configuration, and a stack. The stack includes a plurality of dielectric layers stacked together, and is intended to integrate the first port, the second port, the first LC resonator, the second LC resonator, and the third LC resonator. The first LC resonator includes a first inductor. The second LC resonator includes a second inductor. The first inductor and the second inductor are configured to be magnetically coupled inside the stack.

In the multilayered filter device according to the present invention, the first inductor and the second inductor may adjoin inside the stack.

In the multilayered filter device according to the present invention, the first inductor may include two first through hole lines and a first conductor layer connecting the two first through hole lines. The second inductor may include two second through hole lines and a second conductor layer connecting the two second through hole lines. Each of the two first through hole lines and the two second through hole lines may be formed by connecting two or more through holes in series. There may be no conductor between the two first through hole lines and the two second through hole lines. A first region sandwiched between the two first through hole lines and a second region sandwiched between the two second through hole lines may overlap with each other when seen in a direction orthogonal to a stacking direction of the plurality of dielectric layers. The first conductor layer and the second conductor layer may not overlap with each other when seen in a direction parallel to the stacking direction of the plurality of dielectric layers. The first conductor layer may include a portion that extends in a direction away from the second conductor layer. The second conductor layer may include a portion that extends in a direction away from the first conductor layer.

If the first inductor includes the first conductor layer and the second inductor includes the second conductor layer, the third LC resonator may include a third inductor. The third inductor may include a third conductor layer. The third conductor layer may overlap a region where the first conductor layer or the second conductor layer is located when seen in the direction parallel to the stacking direction of the plurality of dielectric layers. In such a case, the stack may have a first surface opposed to a body to be mounted, and a second surface opposite the first surface. The third conductor layer may be located between the first conductor layer or the second conductor layer and the first surface.

In the multilayered filter device according to the present invention, each of the first LC resonator and the second LC resonator may constitute a low-pass filter. The third LC resonator may constitute a high-pass filter.

In the multilayered filter device according to the present invention, the first inductor and the second inductor are configured to be magnetically coupled inside the stack. According to the present invention, a multilayered filter device having a pass characteristic that changes sharply at a frequency range near a cut-off frequency can thus be provided.

Other and further objects, features and advantages of the present invention will appear more fully from the following description.

DETAILED DESCRIPTION OF THE PREFERRED EMBODIMENTS

Figure 1:
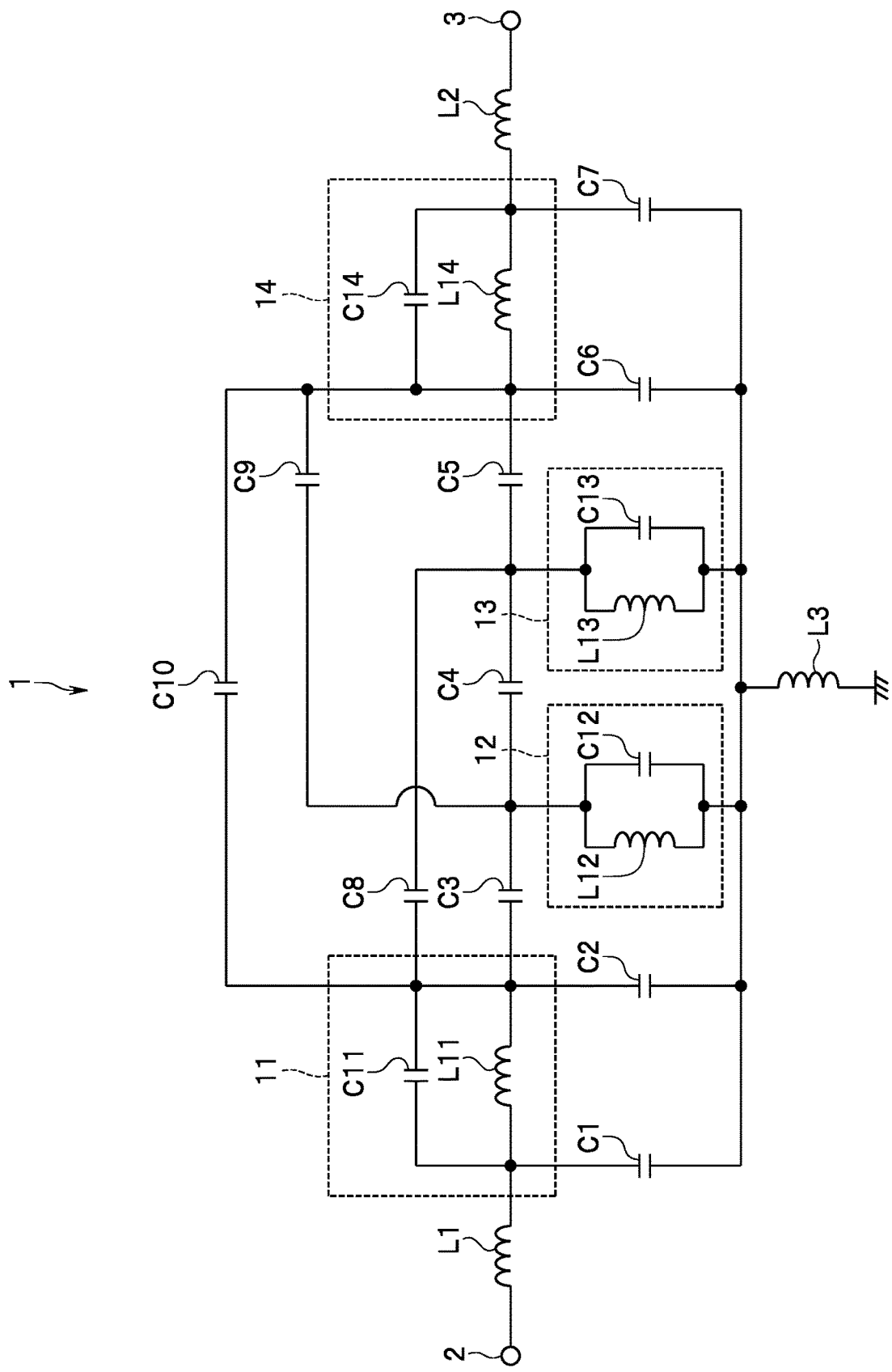
FIG. 1 is a circuit diagram showing a circuit configuration of a multilayered filter device according to an embodiment of the present invention.

An embodiment of the present invention will be described below in detail with reference to the drawings. A configuration of a multilayered filter device (hereinafter, referred to simply as a filter device) 1 according to the embodiment of the present invention will initially be outlined with reference to FIG. 1. FIG. 1 shows a band-pass filter as an example of the filter device 1. The filter device 1 includes a first port 2, a second port 3, and LC resonators 11, 12, 13, and 14. Each of the first and second ports 2 and 3 is a port for inputting or outputting a signal.

The LC resonator 11 is electrically connected to the first port 2. The LC resonator 14 is electrically connected to the second port 3. The LC resonators 12 and 13 are provided between the LC resonators 11 and 14 in such order from the LC resonator 11 side in a circuit configuration. Note that, in the present application, the expression "in the (a) circuit configuration" is used to indicate not a layout in a physical configuration but a layout in a circuit diagram.

The LC resonator 11 corresponds to the "first LC resonator" in the present invention. The LC resonator 14 corresponds to the "second LC resonator" in the present invention. The LC resonators 12 and 13 each correspond to the "third LC resonator" in the present invention.

The LC resonator 11 includes an inductor L11 and a capacitor C11. The LC resonator 12 includes an inductor L12 and a capacitor C12. The LC resonator 13 includes an inductor L13 and a capacitor C13. The LC resonator 14 includes an inductor L14 and a capacitor C14. In particular, in the present embodiment, the inductor and the capacitor in each of the LC resonators 11 to 14 are connected in parallel. As will be described in detail later, the inductor L11 and the inductor L14 are configured to be magnetically coupled with each other.

An example of other circuit configuration of the filter device 1 will be described below with reference to FIG. 1. The filter device 1 further includes inductors L1, L2, and L3, and capacitors C1, C2, C3, C4, C5, C6, C7, C8, C9, and C10. One end of the inductor L1 is connected to the first port 2. One end of the inductor L11 is connected to the other end of the inductor L1. The capacitor C11 is connected in parallel with the inductor L11. One end of the capacitor C1 is connected to the one end of the inductor L11. One end of the capacitor C2 is connected to the other end of the inductor L11.

One end of the capacitor C3 is connected to the other end of the inductor L11. One end of the capacitor C4 is connected to the other end of the capacitor C3. One end of the capacitor C5 is connected to the other end of the capacitor C4. One end of the inductor L12 is connected to the connection point between the capacitors C3 and C4. One end of the inductor L13 is connected to the connection point between the capacitors C4 and C5. The capacitor C12 is connected in parallel with the inductor L12. The capacitor C13 is connected in parallel with the inductor L13.

One end of the inductor L14 is connected to the other end of the capacitor C5. One end of the inductor L2 is connected to the other end of the inductor L14. The other end of the inductor L2 is connected to the second port 3. The capacitor C14 is connected in parallel with the inductor L14. One end of the capacitor C6 is connected to the one end of the inductor L14. One end of the capacitor C7 is connected to the other end of the inductor L14.

One end of each of the capacitors C8 and C10 is connected to the connection point between the inductor L11 and the capacitor C3. The other end of the capacitor C8 is connected to the connection point between the capacitors C4 and C5. One end of the capacitor C9 is connected to the connection point between the capacitors C3 and C4. The other ends of the capacitors C9 and C10 are connected to the connection point between the capacitor C5 and the inductor L14.

One end of the inductor L3 is connected to the other ends of the inductors L12 and L13 and the capacitors C1, C2, C6, and C7. The other end of the inductor L3 is grounded.

The LC resonator 11 and the capacitors C1 and C2 constitute a low-pass filter. The LC resonators 12 and 13 and the capacitors $C_3$ to $C_5$ and C8 to C10 constitute a high-pass filter. The LC resonator 14 and the capacitors C6 and C7 constitute a low-pass filter. The filter device 1 is a band-pass filter including the two low-pass filters and the one high-pass filter in combination.

Possible modes of electrical connection of an LC resonator to a port include one where the LC resonator is directly connected to the port via a conductor and one where the LC resonator is connected to the port via an inductor. By contrast, a mode where the conductor on the path connecting the LC resonator and the port is disconnected, like where the LC resonator is connected to the port via a capacitor, is not included in the modes of electrical connection of the LC resonator to the port.

In the present embodiment, the one end of each of the inductor L11 and the capacitor C11 of the LC resonator 11 is connected to the first port 2 via the inductor L1, whereby the LC resonator 11 is electrically connected to the first port 2. The other ends of the inductor L14 and the capacitor C14 of the LC resonator 14 are connected to the second port 3 via the inductor L2, whereby the LC resonator 14 is electrically connected to the second port 3.

Note that the inductors L1 and L2 are not indispensable components of the filter device 1, and may be omitted. In such a case, the one end of each of the inductor L11 and the capacitor C11 of the LC resonator 11 is directly connected to the first port 2, whereby the LC resonator 11 is electrically connected to the first port 2. Moreover, in such a case, the other ends of the inductor L14 and the capacitor C14 of the LC resonator 14 are directly connected to the second port 3, whereby the LC resonator 14 is electrically connected to the second port 3.

Figure 2:
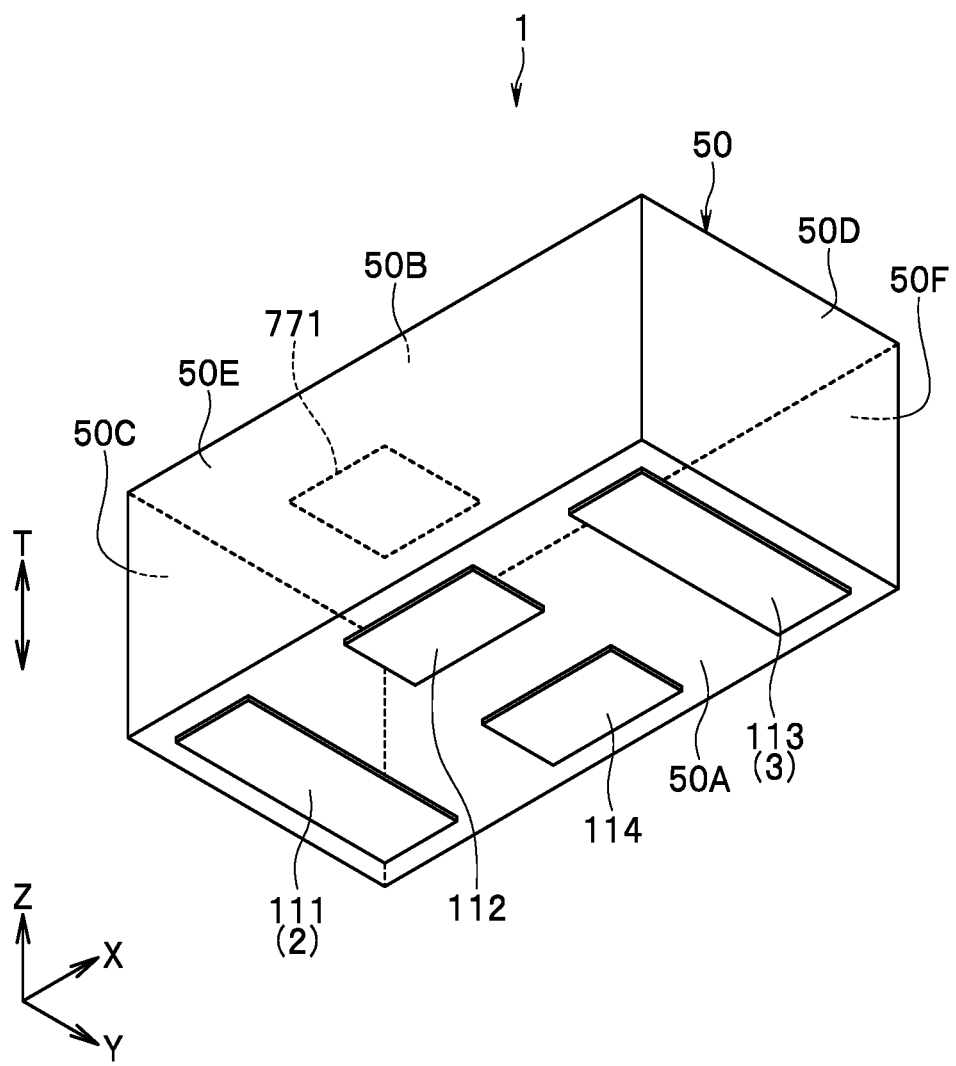
FIG. 2 is a perspective view showing an external appearance of the multilayered filter device according to the embodiment of the present invention.

Next, other configurations of the filter device 1 will be described with reference to FIG. 2. FIG. 2 is a perspective view showing an outside view of the filter device 1.

The filter device 1 further includes a stack 50 including a plurality of dielectric layers and a plurality of conductor layers stacked together. The first port 2, the second port 3, the LC resonators 11 to 14, the inductors L1 to L3, and the capacitors C1 to C10 are integrated with the stack 50.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F are perpendicular to the top surface 50B and the bottom surface 50A.

Here, as shown in FIG. 2, an X direction, a Y direction, and a Z direction are defined. The X direction, the Y direction, and the Z direction are orthogonal to one another. In the present embodiment, a direction in parallel to the stacking direction T is defined as the Z direction. A direction opposite to the X direction is defined as a −X direction, a direction opposite to the Y direction is defined as a −Y direction, and a direction opposite to the Z direction is defined as a −Z direction.

As shown in FIG. 2, the bottom surface 50A is located at the end of the stack 50 in the −Z direction. The top surface 50B is located at the end of the stack 50 in the Z direction. The shape of each of the bottom surface 50A and the top surface 50B is a rectangular shape being long in the X direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The bottom surface 50A is opposed to a not-shown body to be mounted such as a substrate. The bottom surface 50A corresponds to the "first surface" in the present invention. The top surface 50B is located on the opposite side of the stack 50 to the bottom surface 50A. The top surface 50B corresponds to the "second surface" in the present invention.

The filter device 1 further includes terminals 111, 112, 113, and 114 disposed on the bottom surface 50A of the stack 50. The terminal 111 is located closer to the side surface 50C than to the side surface 50D, and extends in a direction parallel to the Y direction. The terminal 113 is located closer to the side surface 50D than to the side surface 50C, and extends in the direction parallel to the Y direction. The terminals 112 and 114 are located between the terminals 111 and 113. The terminal 112 is located closer to the side surface 50E than to the side surface 50F. The terminal 114 is located closer to the side surface 50F than to the side surface 50E.

The terminal 111 corresponds to the first port 2, and the terminal 113 the second port 3. The first and second ports 2 and 3 are thus disposed on the bottom surface 50A of the stack 50. Both the terminals 112 and 114 are grounded.

Next, with reference to FIG. 3A to FIG. 9C, an example of the plurality of dielectric layers and the plurality of conductor layers constituting the stack 50 will be described. In the present example, the stack 50 includes twenty-seven dielectric layers stacked together. The twenty-seven dielectric layers are hereinafter referred to as first to twenty-seventh dielectric layers in the order from bottom to top. The first to twenty-seventh dielectric layers are denoted by reference numerals 51 to 77.

In FIG. 3A to FIG. 9C, each of a plurality of circles represents a through hole. The dielectric layers 51 to 75 each have a plurality of through holes. The plurality of through holes are each formed by filling a hole intended for a through hole with a conductive paste. Each of the plurality of through holes is connected to a terminal, a conductor layer or another through hole.

Figure 3A:
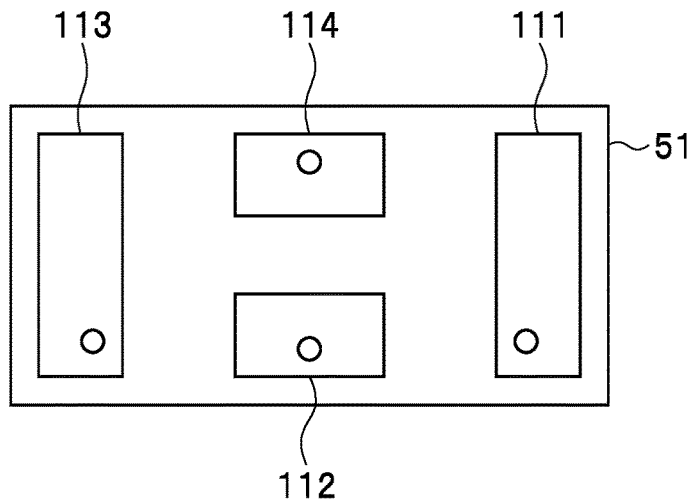
FIG. 3A to FIG. 3C are explanatory diagrams showing respective patterned surfaces of first to third dielectric layers of a stack of the multilayered filter device according to the embodiment of the present invention.
Figure 3B:
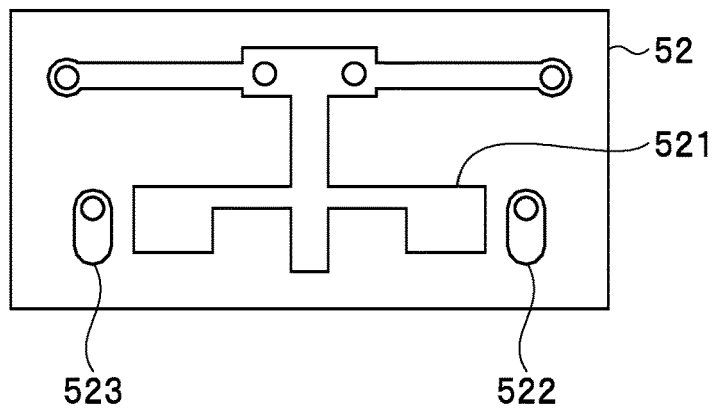

FIG. 3A shows a patterned surface of the first dielectric layer 51. The terminals 111 to 114 are formed on the patterned surface of the dielectric layer 51. FIG. 3B shows a patterned surface of the second dielectric layer 52. Conductor layer 521, 522, and 523 are formed on the patterned surface of the dielectric layer 52.

Figure 3C:
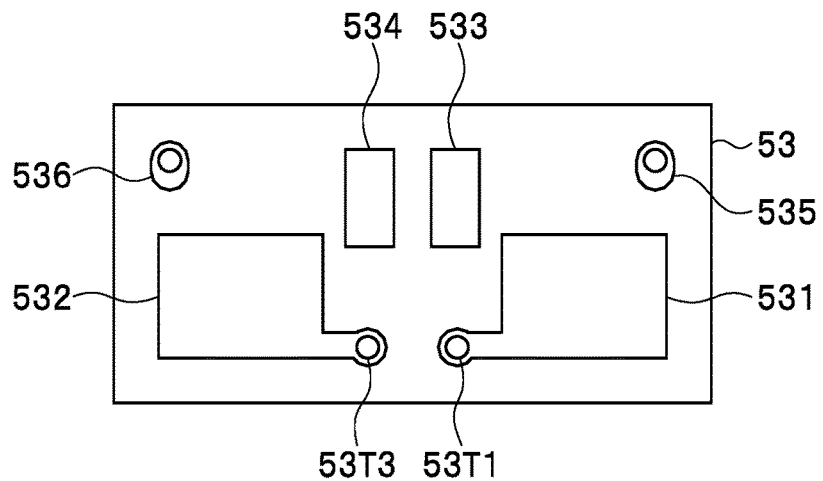

FIG. 3C shows a patterned surface of the third dielectric layer 53. Conductor layers 531, 532, 533, and 534 are formed on the patterned surface of the dielectric layer 53. In FIG. 3C, two specific through holes connected to the conductor layers 531 and 532 are denoted by reference numerals 53T1 and 53T3, respectively.

Figure 4A:
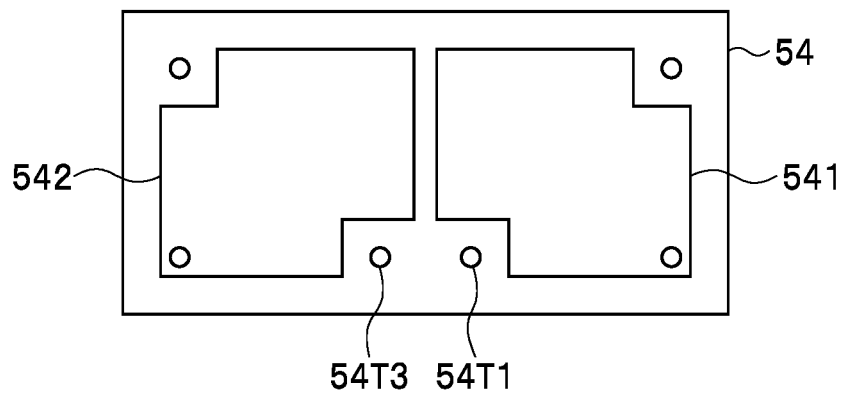
FIG. 4A to FIG. 4C are explanatory diagrams showing respective patterned surfaces of fourth to sixth dielectric layers of the stack of the multilayered filter device according to the embodiment of the present invention.

FIG. 4A shows a patterned surface of the fourth dielectric layer 54. Conductor layers 541 and 542 are formed on the patterned surface of the dielectric layer 54. In FIG. 4A, two specific through holes connected to the specific through holes 53T1 and 53T3 formed in the dielectric layer 53 are denoted by reference numerals 54T1 and 54T3, respectively.

Figure 4B:
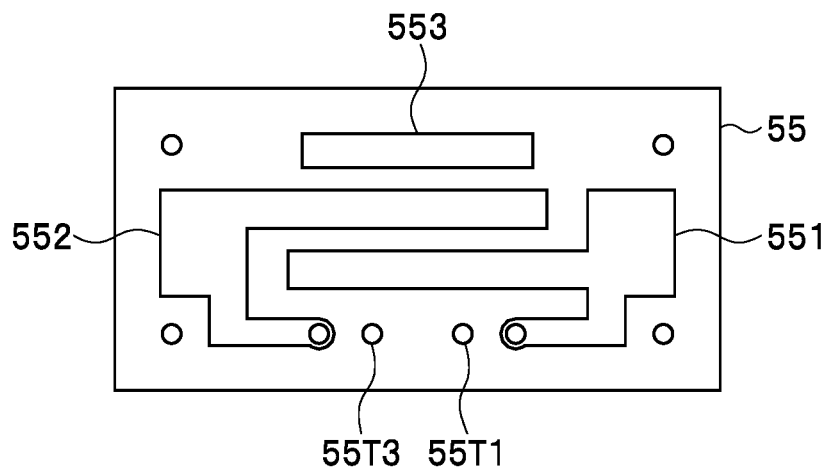

FIG. 4B shows a patterned surface of the fifth dielectric layer 55. Conductor layer 551, 552, and 553 are formed on the patterned surface of the dielectric layer 55. In FIG. 4B, two specific through holes connected to the specific through holes 54T1 and 54T3 formed in the dielectric layer 54 are denoted by reference numerals 55T1 and 55T3, respectively.

Figure 4C:
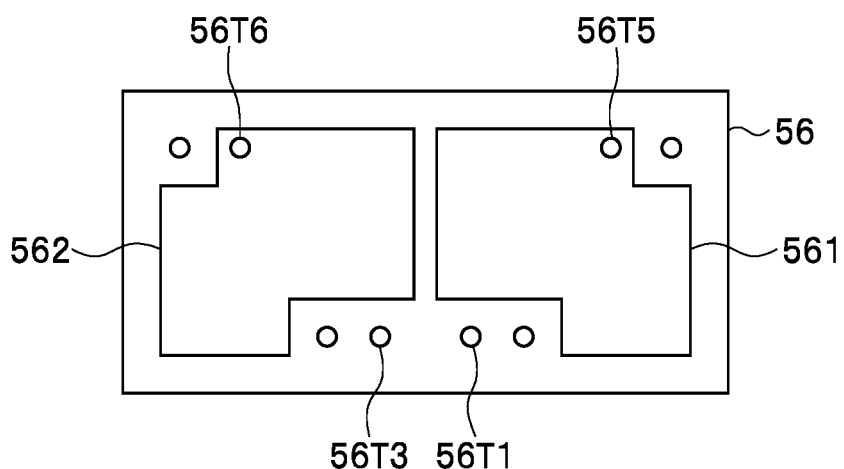

FIG. 4C shows a patterned surface of the sixth dielectric layer 56. Conductor layer 561 and 562 are formed on patterned surface of the dielectric layer 56. In FIG. 4C, two specific through holes connected to the specific through holes 55T1 and 55T3 formed in the dielectric layer 55 are denoted by reference numerals 56T1 and 56T3, respectively. Two specific through holes connected to the conductor layers 561 and 562 are denoted by reference numerals 56T5 and 56T6, respectively.

Figure 5A:
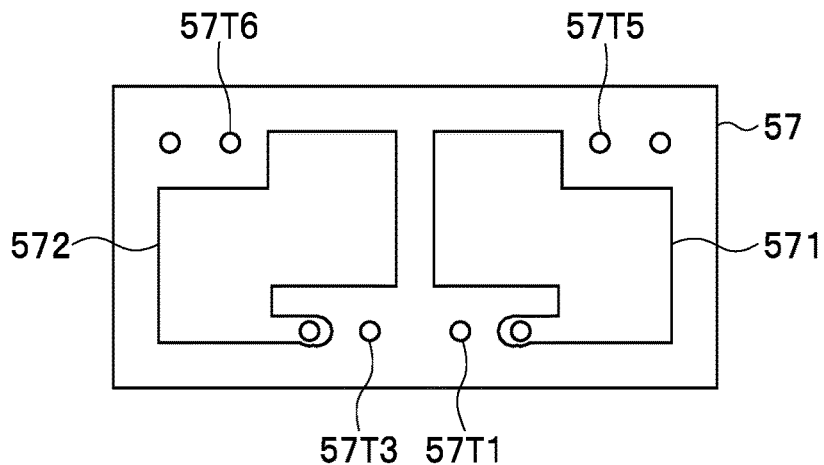
FIG. 5A is an explanatory diagram showing a patterned surface of a seventh dielectric layer of the stack of the multilayered filter device according to the embodiment of the present invention.

FIG. 5A shows a patterned surface of the seventh dielectric layer 57. Conductor layers 571 and 572 are formed on the patterned surface of the dielectric layer 57. In FIG. 5A, four specific through holes connected to the specific through holes 56T1, 56T3, 56T5, and 56T6 formed in the dielectric layer 56 are denoted by reference numerals 57T1, 57T3, 57T5, and 57T6, respectively.

Figure 5B:
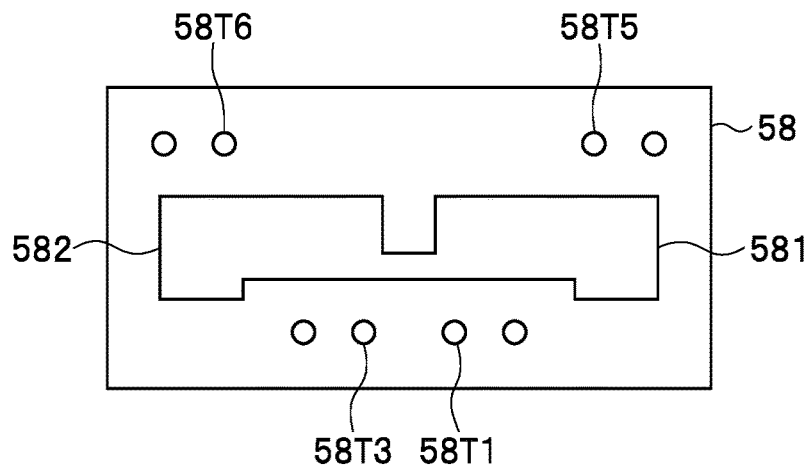
FIG. 5B is an explanatory diagram showing a patterned surface of an eighth dielectric layer of the stack of the multilayered filter device according to the embodiment of the present invention.

FIG. 5B shows a patterned surface of the eighth dielectric layer 58. A conductor layer 581 is formed on the patterned surface of the dielectric layer 58. In FIG. 5B, four specific through holes connected to the specific through holes 57T1, 57T3, 57T5, and 57T6 formed in the dielectric layer 57 are denoted by reference numerals 58T1, 58T3, 58T5, and 58T6, respectively.

Figure 5C:
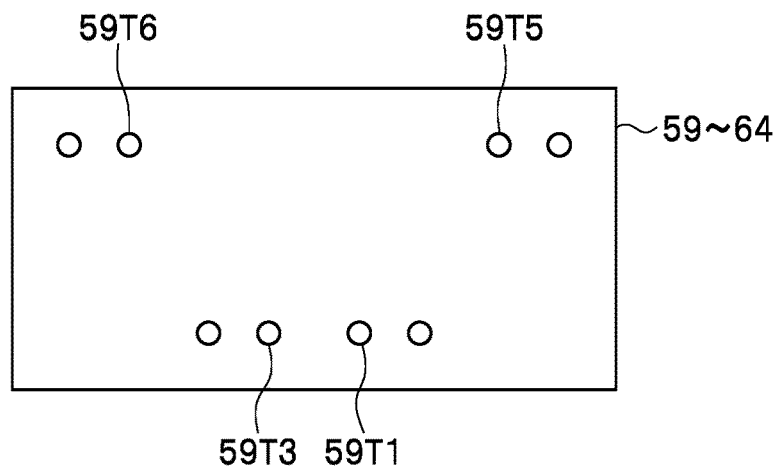
FIG. 5C is an explanatory diagram showing a patterned surface of ninth to fourteenth dielectric layers of the stack of the multilayered filter device according to the embodiment of the present invention.

FIG. 5C shows a patterned surface of each of the ninth to fourteenth dielectric layers 59 to 64. Specific through holes 59T1, 59T3, 59T5, and 59T6 are formed in each of the dielectric layers 59 to 64. The specific through holes 58T1, 58T3, 58T5, and 58T6 formed in the dielectric layer 58 are connected respectively to the specific through holes 59T1, 59T3, 59T5, and 59T6 formed in the dielectric layer 59. The through holes having the same reference numerals in upper and lower, adjoining ones of the dielectric layers 59 to 64 are connected to each other.

Figure 6A:
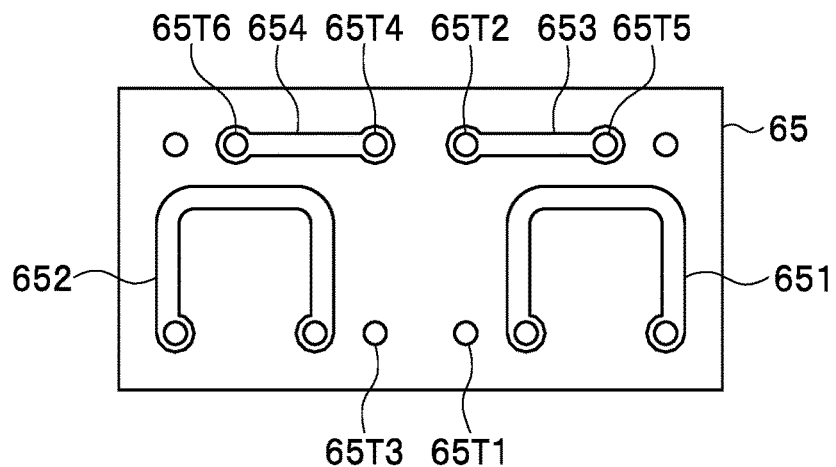
FIG. 6A to FIG. 6C are explanatory diagrams showing respective patterned surfaces of fifteenth to seventeenth dielectric layers of the stack of the multilayered filter device according to the embodiment of the present invention.

FIG. 6A shows a patterned surface of the fifteenth dielectric layer 65. Inductor conductor layers 651 and 652 and conductor layers 653 and 654 are formed on the patterned surface of the dielectric layer 65. Each of the conductor layers 653 and 654 has a first end and a second end opposite to each other. The specific through hole 59T5 formed in the dielectric layer 64 is connected to a portion of the conductor layer 653 near the first end thereof. The specific through hole 59T6 formed in the dielectric layer 64 is connected to a portion of the conductor layer 654 near the first end thereof.

In FIG. 6A, two specific through holes connected to the specific through holes 59T1 and 59T3 formed in the dielectric layer 64 are denoted by reference numerals 65T1 and 65T3, respectively. A specific through hole connected to a portion of the conductor layer 653 near the second end thereof is denoted by a reference numeral 65T2. A specific through hole connected to a portion of the conductor layer 654 near the second end thereof is denoted by a reference numeral 65T4. A specific through hole connected to a portion of the conductor layer 653 near the first end thereof is denoted by a reference numeral 65T5. A specific through hole connected to a portion of the conductor layer 654 near the first end thereof is denoted by a reference numeral 65T6.

Figure 6B:
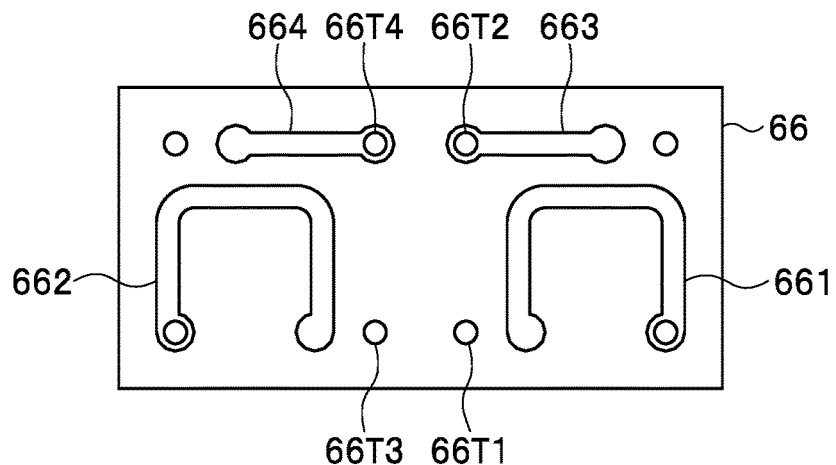

FIG. 6B shows a patterned surface of the sixteenth dielectric layer 66. Inductor conductor layers 661 and 662 and conductor layers 663 and 664 are formed on the patterned surface of the dielectric layer 66. Each of the conductor layers 663 and 664 has a first end and a second end opposite to each other. The specific through hole 65T2 formed in the dielectric layer 65 is connected to a portion of the conductor layer 663 near the second end thereof. The specific through hole 65T4 formed in the dielectric layer 65 is connected to a portion of the conductor layer 664 near the second end thereof. The specific through hole 65T5 formed in the dielectric layer 65 is connected to a portion of the conductor layer 663 near the first end thereof. The specific through hole 65T6 formed in the dielectric layer 65 is connected to a portion of the conductor layer 664 near the first end thereof.

In FIG. 6B, two specific through holes connected to the specific through holes 65T1 and 65T3 formed in the dielectric layer 65 are denoted by reference numerals 66T1 and 66T3, respectively. A specific through hole connected to a portion of the conductor layer 663 near the second end thereof is denoted by a reference numeral 66T2. A specific through hole connected to a portion of the conductor layer 664 near the second end thereof is denoted by a reference numeral 66T4.

Figure 6C:
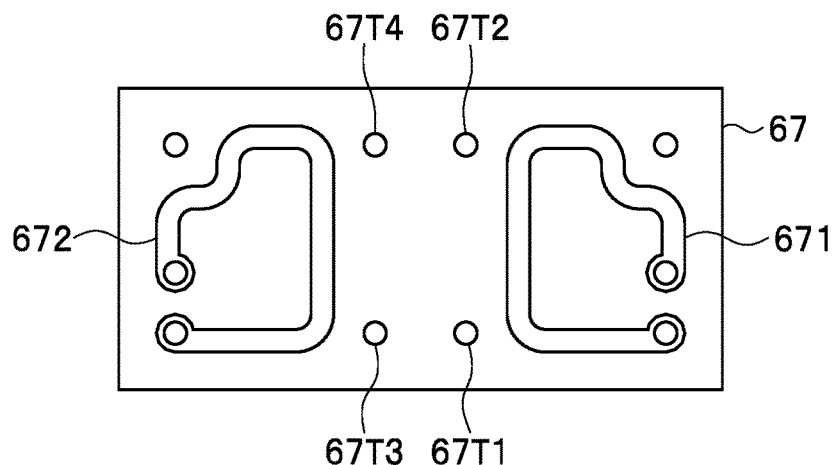

FIG. 6C shows a patterned surface of the seventeenth dielectric layer 67. Inductor conductor layers 671 and 672 are formed on the patterned surface of the dielectric layer 67. In FIG. 6C, four specific through holes connected to the specific through holes 66T1, 66T2, 66T3, and 66T4 formed in the dielectric layer 66 are denoted by reference numerals 67T1, 67T2, 67T3, and 67T4, respectively.

Figure 7A:
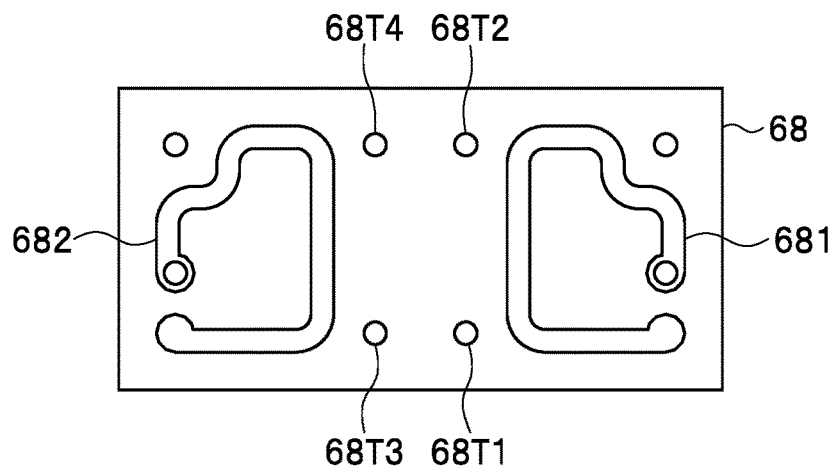
FIG. 7A to FIG. 7C are explanatory diagrams showing respective patterned surfaces of eighteenth to twentieth dielectric layers of the stack of the multilayered filter device according to the embodiment of the present invention.

FIG. 7A shows a patterned surface of the eighteenth dielectric layer 68. Inductor conductor layers 681 and 682 are formed on the patterned surface of the dielectric layer 68. In FIG. 7A, four specific through holes connected to the specific through holes 67T1, 67T2, 67T3, and 67T4 formed in the dielectric layer 67 are denoted by reference numerals 68T1, 68T2, 68T3, and 68T4, respectively.

Figure 7B:
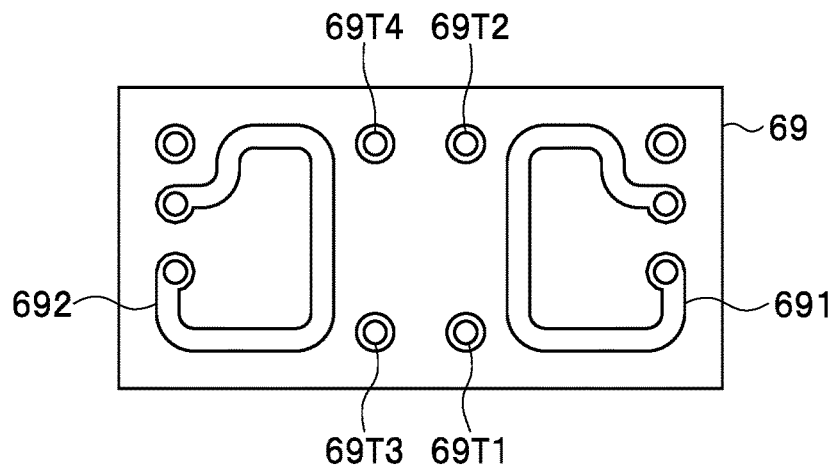

FIG. 7B shows a patterned surface of the nineteenth dielectric layer 69. Inductor conductor layers 691 and 692 are formed on the patterned surface of the dielectric layer 69. In FIG. 7B, four specific through holes connected to the specific through holes 68T1, 68T2, 68T3, and 68T4 formed in the dielectric layer 68 are denoted by reference numerals 69T1, 69T2, 69T3, and 69T4, respectively.

Figure 7C:
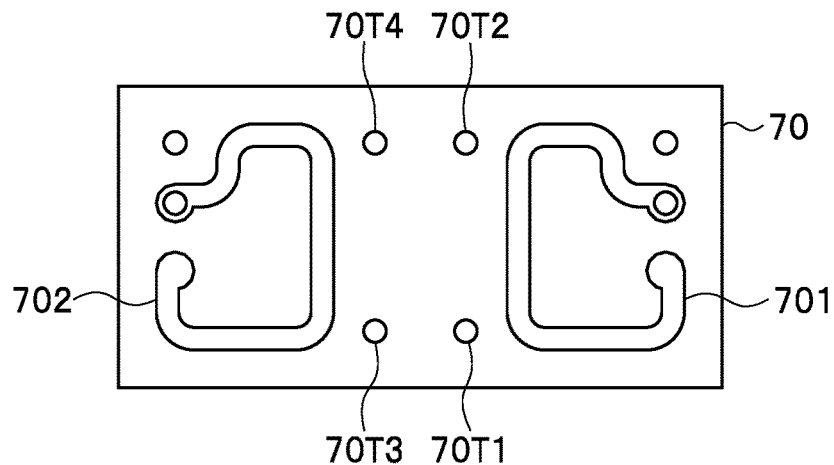

FIG. 7C shows a patterned surface of the twentieth dielectric layer 70. Inductor conductor layers 701 and 702 are formed on the patterned surface of the dielectric layer 70. In FIG. 7C, four specific through holes connected to the specific through holes 69T1, 69T2, 69T3, and 69T4 formed in the dielectric layer 69 are denoted by reference numerals 70T1, 70T2, 70T3, and 70T4, respectively.

Figure 8A:
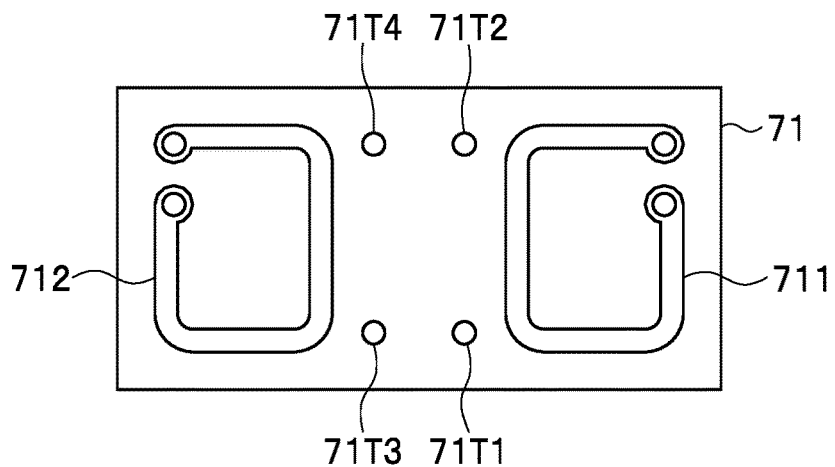
FIG. 8A is an explanatory diagram showing a patterned surface of a twenty-first dielectric layer of the stack of the multilayered filter device according to the embodiment of the present invention.

FIG. 8A shows a patterned surface of the twenty-first dielectric layer 71. Inductor conductor layers 711 and 712 are formed on the patterned surface of the dielectric layer 71. In FIG. 8A, four specific through holes connected to the specific through holes 70T1, 70T2, 70T3, and 70T4 formed in the dielectric layer 70 are denoted by reference numerals 71T1, 71T2, 71T3, and 71T4, respectively.

Figure 8B:
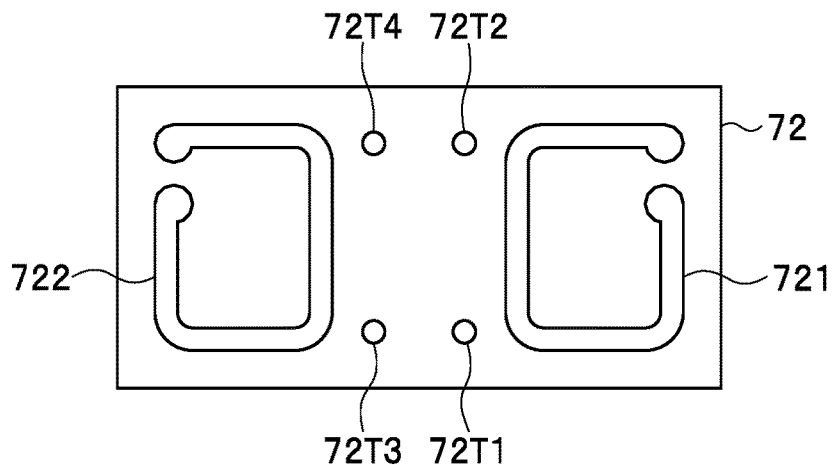
FIG. 8B is an explanatory diagram showing a patterned surface of a twenty-second dielectric layer of the stack of the multilayered filter device according to the embodiment of the present invention.

FIG. 8B shows a patterned surface of the twenty-second dielectric layer 72. Inductor conductor layers 721 and 722 are formed on the patterned surface of the dielectric layer 72. In FIG. 8B, four specific through holes connected to the specific through holes 71T1, 71T2, 71T3, and 71T4 formed in the dielectric layer 71 are denoted by reference numerals 72T1, 72T2, 72T3, and 72T4, respectively.

Figure 8C:
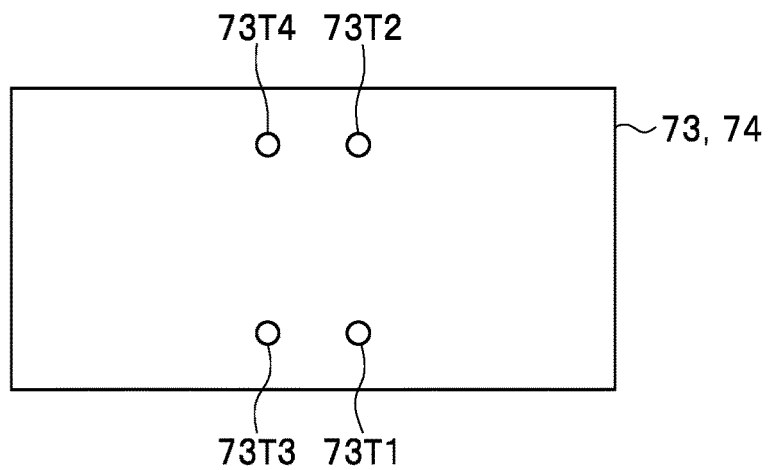
FIG. 8C is an explanatory diagram showing a patterned surface of twenty-third and twenty-fourth dielectric layers of the stack of the multilayered filter device according to the embodiment of the present invention.

FIG. 8C shows a patterned surface of each of the twenty-third and twenty-fourth dielectric layers 73 and 74. Specific through holes 73T1, 73T2, 73T3, and 73T4 are formed in each of the dielectric layers 73 and 74. The specific through holes 72T1 to 72T4 formed in the dielectric layer 72 are connected respectively to the specific through holes 73T1 to 73T4 formed in the dielectric layer 73. Upper and lower, adjoining through holes having the same reference numerals in the dielectric layers 73 and 74 are connected to each other.

Figure 9A:
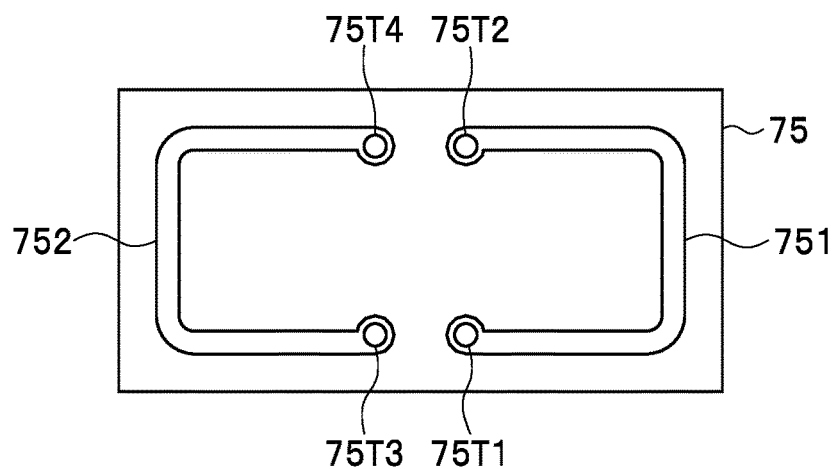
FIG. 9A to FIG. 9C are explanatory diagrams showing respective patterned surfaces of twenty-fifth to twenty-seventh dielectric layers of the stack of the multilayered filter device according to the embodiment of the present invention.

FIG. 9A shows a patterned surface of the twenty-fifth dielectric layer 75. Inductor conductor layers 751 and 752 are formed on the patterned surface of the dielectric layer 75. Each of the conductor layers 751 and 752 has a first end and a second end opposite to each other. The specific through hole 73T1 formed in the dielectric layer 74 is connected to a portion of the conductor layer 751 near the first end thereof. The specific through hole 73T2 formed in the dielectric layer 74 is connected to a portion of the conductor layer 751 near the second end thereof. The specific through hole 73T3 formed in the dielectric layer 74 is connected to a portion of the conductor layer 752 near the first end thereof. The specific through hole 73T4 formed in the dielectric layer 74 is connected to a portion of the conductor layer 752 near the second end thereof.

In FIG. 9A, a specific through hole connected to a portion of the conductor layer 751 near the first end thereof is denoted by a reference numeral 75T1. A specific through hole connected to a portion of the conductor layer 751 near the second end thereof is denoted by a reference numeral 75T2. A specific through hole connected to a portion of the conductor layer 752 near the first end thereof is denoted by a reference numeral 75T3. A specific through hole connected to a portion of the conductor layer 752 near the second end thereof is denoted by a reference numeral 75T4.

Figure 9B:
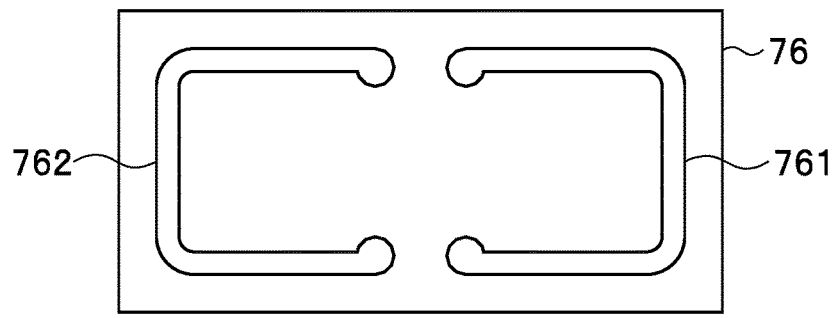

FIG. 9B shows a patterned surface of the twenty-sixth dielectric layer 76. Inductor conductor layers 761 and 762 are formed on the patterned surface of the dielectric layer 76. Each of the conductor layers 761 and 762 has a first end and a second end opposite to each other. The specific through hole 75T1 formed in the dielectric layer 75 is connected to a portion of the conductor layer 761 near the first end thereof. The specific through hole 75T2 formed in the dielectric layer 75 is connected to a portion of the conductor layer 761 near the second end thereof. The specific through hole 75T3 formed in the dielectric layer 75 is connected to a portion of the conductor layer 762 near the first end thereof. The specific through hole 75T4 formed in the dielectric layer 75 is connected to a portion of the conductor layer 762 near the second end thereof.

Figure 9C:
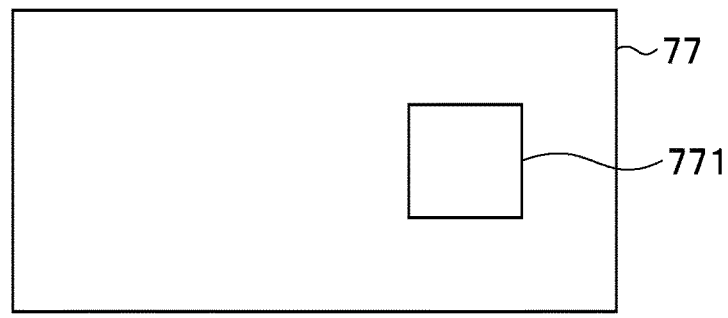

FIG. 9C shows a patterned surface of the twenty-seventh dielectric layer 77. A mark 771 formed of a conductor layer is formed on the patterned surface of the dielectric layer 77.

The stack 50 shown in FIG. 2 is formed by stacking the first to twenty-seventh dielectric layers 51 to 77 such that the patterned surface of the first dielectric layer 51 serves as the bottom surface 50A of the stack 50 and the surface of the twenty-seventh dielectric layer 77 opposite to the patterned surface thereof serves as the top surface 50B of the stack 50.

Each of the through holes shown in FIG. 3A to FIG. 8A except for the plurality of specific through holes denoted by the reference numerals is connected to a conductor layer overlapping in the stacking direction T or another through hole overlapping in the stacking direction T when the first to twenty-seventh dielectric layers 51 to 77 are stacked. Of the through holes shown in FIG. 3A to FIG. 8A except for the plurality of specific through holes, ones located within a terminal or conductor layer are connected to the terminal or conductor layer.

Figure 10:
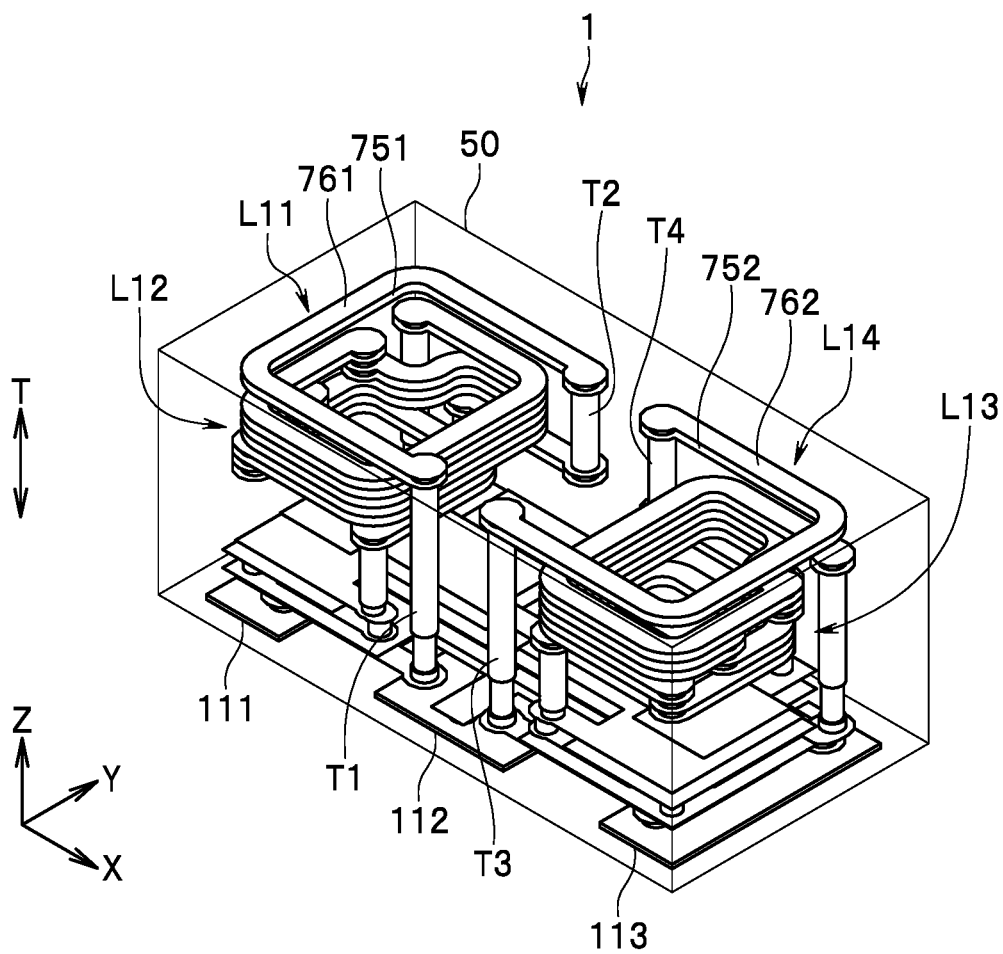
FIG. 10 is a perspective view showing an internal structure of the stack of the multilayered filter device according to the embodiment of the present invention.
Figure 11:
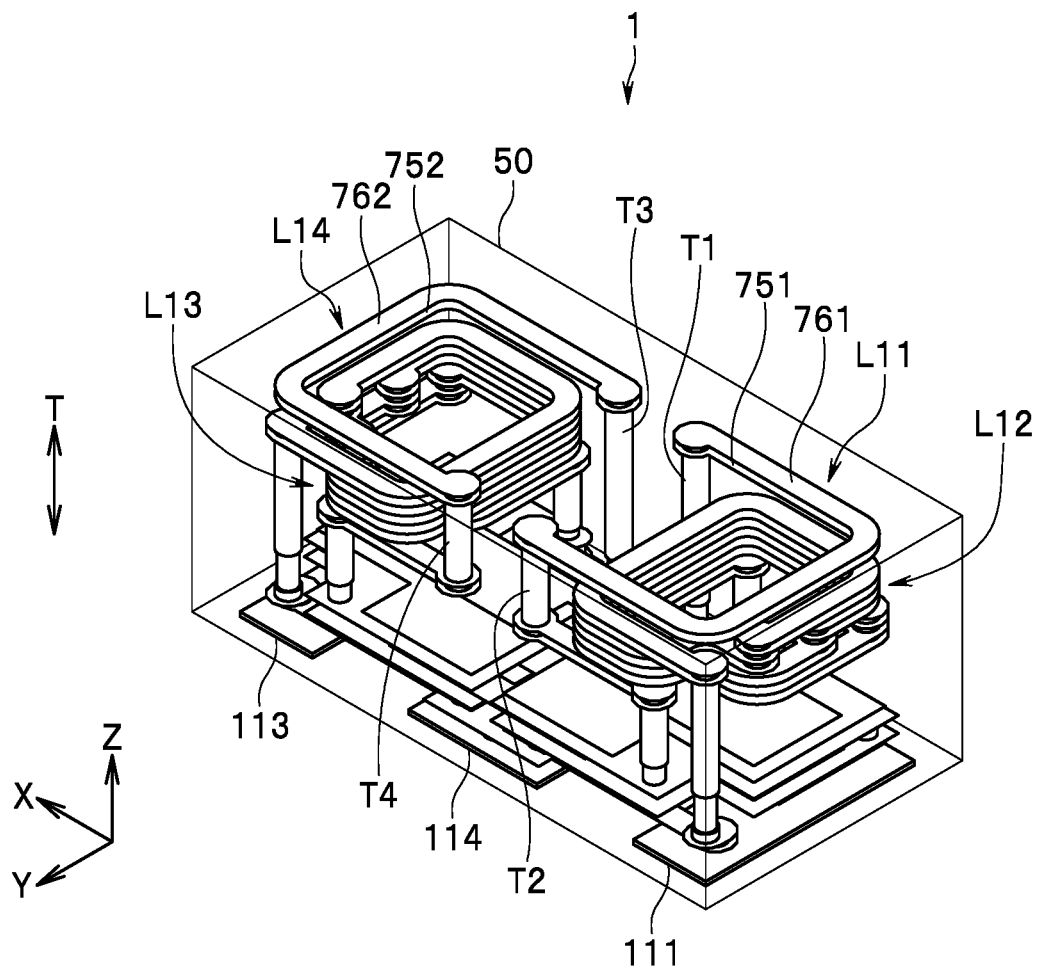
FIG. 11 is a perspective view showing an internal structure of the stack of the multilayered filter device according to the embodiment of the present invention.

FIG. 10 and FIG. 11 show the internal structure of the stack 50 constituted by stacking the first to twenty-seventh dielectric layers 51 to 77. FIG. 10 shows the internal structure of the stack 50 as seen from the side surface 50D and 50E side. FIG. 11 shows the internal structure of the stack 50 as seen from the side surface 50C and 50F side. As shown in FIG. 10 and FIG. 11, the plurality of conductor layers and the plurality of through holes shown in FIG. 3A to FIG. 9C are stacked together inside the stack 50. In FIG. 10 and FIG. 11, the mark 771 is omitted.

A correspondence between the circuit components of the filter device 1 shown in FIG. 1 and the internal components of the stack 50 shown in FIG. 3A to FIG. 9B will now be described. The inductor L11 of the LC resonator 11 is composed of the inductor conductor layers 751 and 761 and the specific through holes 53T1, 54T1, 55T1, 56T1, 57T1, 58T1, 59T1, 65T1, 66T1, 66T2, 67T1, 67T2, 68T1, 68T2, 69T1, 69T2, 70T1, 70T2, 71T1, 71T2, 72T1, 72T2, 73T1, 73T2, 75T1, and 75T2. The capacitor C11 of the LC resonator 11 is composed of the conductor layers 531 and 541 and the dielectric layer 53 between the conductor layers.

The inductor L12 of the LC resonator 12 is composed of the inductor conductor layers 651, 661, 671, 681, 691, 701, 711, and 721, and the plurality of through holes connected to the conductor layers. The capacitor C12 of the LC resonator 12 is composed of the conductor layers 521 and 551 and the dielectric layers 52 to 54 between the conductor layers.

The inductor L13 of the LC resonator 13 is composed of the inductor conductor layers 652, 662, 672, 682, 692, 702, 712, and 722, and the plurality of through holes connected to the conductor layers. The capacitor C13 of the LC resonator 13 is composed of the conductor layers 521 and 552 and the dielectric layers 52 to 54 between the conductor layers.

The inductor L14 of the LC resonator 14 is composed of the inductor conductor layers 752 and 762 and the specific through holes 53T3, 54T3, 55T3, 56T3, 57T3, 58T3, 59T3, 65T3, 66T3, 66T4, 67T3, 67T4, 68T3, 68T4, 69T3, 69T4, 70T3, 70T4, 71T3, 71T4, 72T3, 72T4, 73T3, 73T4, 75T3, and 75T4. The capacitor C14 of the LC resonator 14 is composed of the conductor layers 532 and 542 and the dielectric layer 53 between the conductor layers.

The capacitor C1 is composed of the conductor layers 521 and 531 and the dielectric layer 52 between the conductor layers. The capacitor C2 is composed of the conductor layers 533 and 541 and the dielectric layer 53 between the conductor layers.

The capacitor C3 is composed of the conductor layers 541, 551, 561, and 571, and the dielectric layers 54 to 56 between the conductor layers. The capacitor C4 is composed of the conductor layers 571, 572, and 581, and the dielectric layer 57 between the conductor layers. The capacitor C5 is composed of the conductor layers 542, 552, 562, and 572, and the dielectric layers 54 to 56 between the conductor layers.

The capacitor C6 is composed of the dielectric layers 534 and 542 and the dielectric layer 53 between the conductor layers. The capacitor C7 is composed of the conductor layers 521 and 532 and the dielectric layer 52 between the conductor layers.

The capacitor C8 is composed of the conductor layers 541 and 552 and the dielectric layer 54 between the conductor layers. The capacitor C9 is composed of the conductor layers 542 and 551 and the dielectric layer 54 between the conductor layers. The capacitor C10 is composed of the conductor layers 541, 542, and 553 and the dielectric layer 54 between the conductor layers.

The inductor L1 is composed of the conductors (including the conductor layer 522) connecting the terminal 111 and the conductor layer 531. The inductor L2 is composed of the conductors (including the conductor layer 523) connecting the terminal 113 and the conductor layer 532. The inductor L3 is composed of the conductor layer 521, the plurality of through holes connecting the terminals 112 and 114 and the conductor layer 521, the conductors (including the conductor layer 535) connecting the inductor conductor layer 711 and the conductor layer 521, and the conductors (including the conductor layer 536) connecting the inductor conductor layer 712 and the conductor layer 521.

Next, structural characteristics of the filter device 1 according to the present embodiment will be described with reference to FIG. 2 to FIG. 11. As employed herein, a structure formed by connecting two or more through holes in series will be referred to as a through hole line. The stack 50 includes through hole lines T1, T2, T3, and T4. The through hole line T1 is composed of the specific through holes 53T1, 54T1, 55T1, 56T1, 57T1, 58T1, 59T1, 65T1, 66T1, 67T1, 68T1, 69T1, 70T1, 71T1, 72T1, 73T1, and 75T1. The through hole line T2 is composed of the specific through holes 66T2, 67T2, 68T2, 69T2, 70T2, 71T2, 72T2, 73T2, and 75T2. The through hole line T3 is composed of the specific through holes 53T3, 54T3, 55T3, 56T3, 57T3, 58T3, 59T3, 65T3, 66T3, 67T3, 68T3, 69T3, 70T3, 71T3, 72T3, 73T3, and 75T3. The through hole line T4 is composed of the specific through holes 66T4, 67T4, 68T4, 69T4, 70T4, 71T4, 72T4, 73T4, and 75T4.

The inductor L11 of the LC resonator 11 includes the through hole lines T1 and T2 and the inductor conductor layers 751 and 761. The inductor L14 of the LC resonator 14 includes the through hole lines T3 and T4 and the inductor conductor layers 752 and 762. Each of the inductor conductor layers 751 and 761 connects the through hole lines T1 and T2. Each of the inductor conductor layers 752 and 762 connects the through hole lines T3 and T4.

Each of the through hole lines T1 and T2 corresponds to the "first through hole line" in the present invention. Each of the through hole lines T3 and T4 corresponds to the "second through hole line" in the present invention. Each of the inductor conductor layers 751 and 761 corresponds to the "first conductor layer" in the present invention. Each of the inductor conductor layers 752 and 762 corresponds to the "second conductor layer" in the present invention.

The inductors L11 and L14 are configured to be magnetically coupled inside the stack 50. In particular, in the present embodiment, the inductors L11 and L14 are located to adjoin inside the stack 50 for the sake of magnetic coupling. Specifically, the through hole lines T1 and T2 of the inductor L11 and the through holes lines T3 and T4 of the inductor L14 are located near the center of the stack 50 in the direction parallel to the Y direction (longitudinal directions of the bottom surface 50A and the top surface 50B) and adjoin each other inside the stack 50. No conductor exists between the through hole lines T1 and T3 or between the through hole lines T2 and T4. Moreover, the inductor conductor layers 751 and 761 of the inductor L11 and the inductor conductor layers 752 and 762 of the inductor L14 adjoin inside the stack 50. No conductor exists between the inductor conductor layers 751 and 752 or between the inductor conductor layers 761 and 762.

Now, a region sandwiched between the through hole lines T1 and T2 will be referred to as a first region. A region sandwiched between the through hole lines T3 and T4 will be referred to as a second region. The first region and the second region overlap with each other when seen in the Y direction, i.e., when the first and second regions are seen from a position in front of the stack 50 in the Y direction. The first and second regions may be the same when seen in the Y direction.

The inductor conductor layer 751 and the inductor conductor layer 752 do not overlap with each other when seen in the Z direction, i.e., when the inductor conductor layers 751 and 752 are seen from a position in front of the stack 50 in the Z direction. Similarly, the inductor conductor layer 761 and the inductor conductor layer 762 do not overlap with each other when seen in the Z direction, i.e., when the inductor conductor layers 761 and 762 are seen from a position in front of the stack 50 in the Z direction.

Each of the inductor conductor layers 751 and 752 has a planar U-shape. More specifically, the inductor conductor layer 751 includes two portions that extend in a direction away from the inductor conductor layer 752 (−X direction), and a portion that connects the two portions and extends in the direction parallel to the Y direction. The inductor conductor layer 752 includes two portions that extend in a direction away from the inductor conductor layer 751 (X direction), and a portion that connects the two portions and extends in the direction parallel to the Y direction.

Similarly, each of the inductor conductor layers 761 and 762 has a planar U-shape. More specifically, the inductor conductor layer 761 includes two portions that extend in a direction away from the inductor conductor layer 762 (−X direction), and a portion that connects the two portions and extends in the direction parallel to the Y direction. The inductor conductor layer 762 includes two portions that extend in a direction away from the inductor conductor layer 761 (X direction), and a portion that connects the two portions and extends in the direction parallel to the Y direction.

The inductor conductor layers 651, 661, 671, 681, 691, 701, 711, and 721 constituting the inductor L12 of the LC resonator 12 overlap the region where the inductor conductor layers 751 and 761 are located when seen in the Z direction. The inductor conductor layers 651, 661, 671, 681, 691, 701, 711, and 721 may overlap the inductor conductor layers 751 and 761 themselves, or overlap the region surrounded by the inductor conductor layers 751 and 761.

The inductor conductor layers 652, 662, 672, 682, 692, 702, 712, and 722 constituting the inductor L13 of the LC resonator 13 overlap the region where the inductor conductor layers 752 and 762 are located when seen in the Z direction. The inductor conductor layers 652, 662, 672, 682, 692, 702, 712, and 722 may overlap the inductor conductor layers 752 and 762 themselves, or overlap the region surrounded by the inductor conductor layers 752 and 762.

Next, operation and effects of the filter device 1 according to the present embodiment will be described. In the present embodiment, the inductors L11 and L14 are configured to be magnetically coupled inside the stack 50. According to the present embodiment, a pass characteristic changing sharply at a frequency range near a cut-off frequency can thereby be implemented. This effect will now be described with reference to simulation results.

The simulation used a model of the structure of the filter device 1 shown in FIG. 2 to FIG. 11 and a model of the circuit of the filter device 1 shown in FIG. 1. Both the structure model and the circuit model were configured as a model of the band-pass filter. In the circuit model, the inductors L11 and L14 were not magnetically coupled.

In the simulation, the structure model and the circuit model were designed so that the structure model and the circuit model had substantially the same passbands, and insertion loss and return loss in the respective passbands of the structure model and the circuit model were substantially the same.

Figure 12:
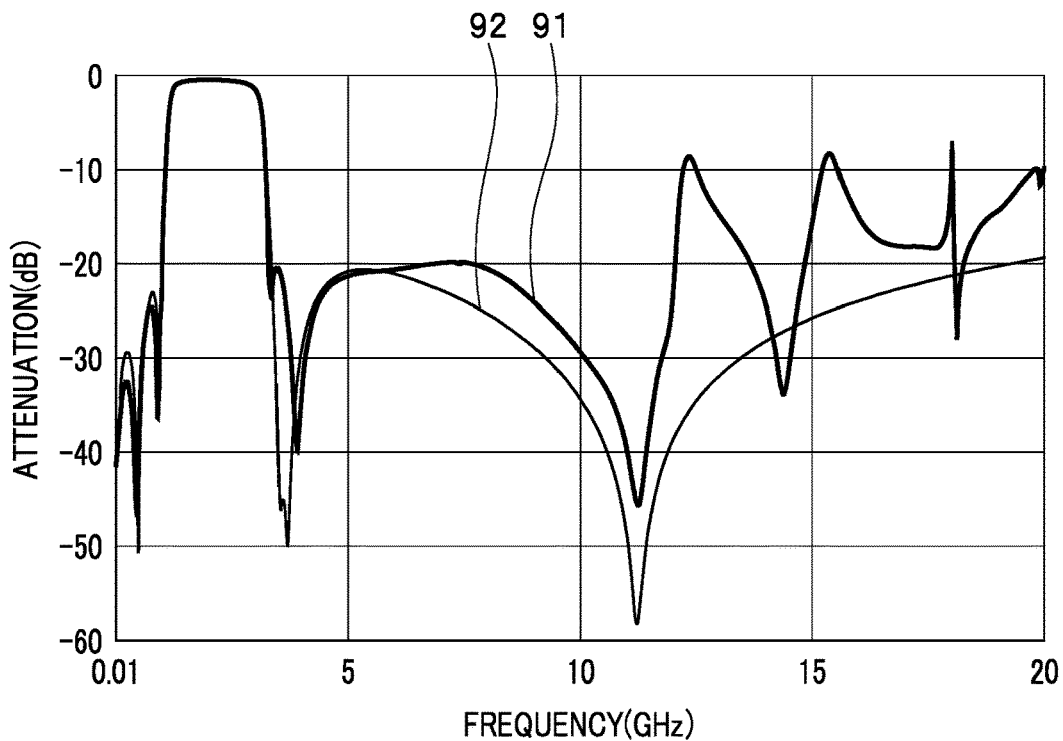
FIG. 12 is a characteristic chart showing a pass characteristic obtained by simulation.
Figure 13:
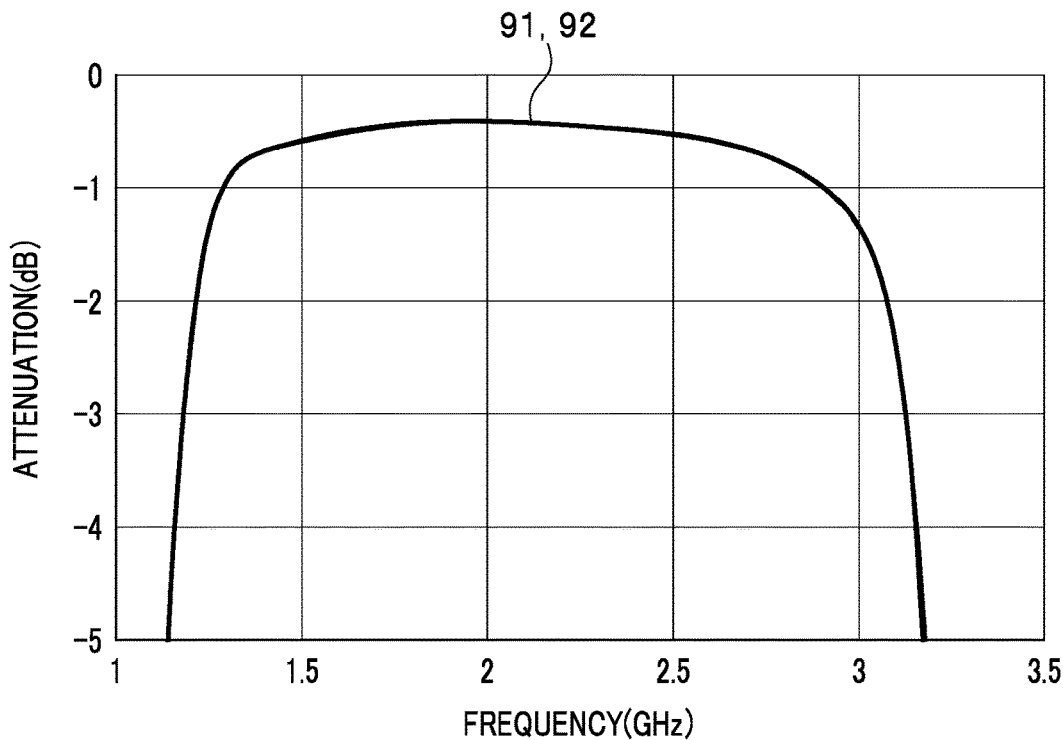
FIG. 13 is an enlarged characteristic chart showing a part of FIG. 12.
Figure 14:
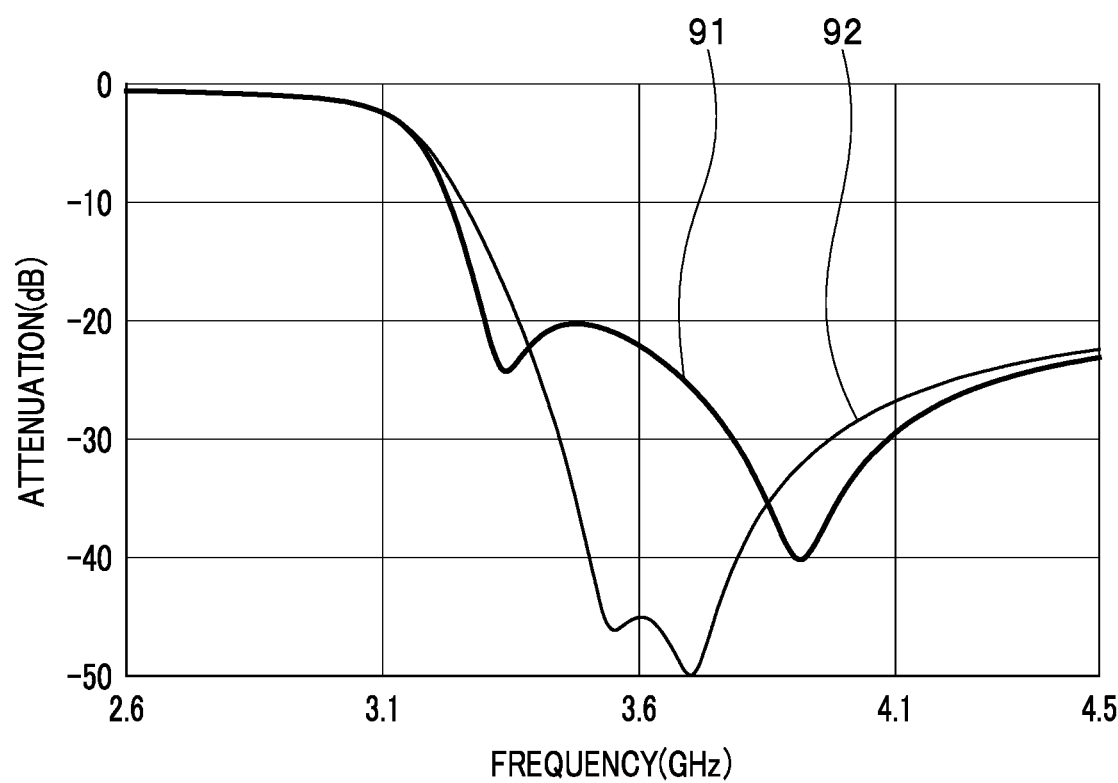
FIG. 14 is an enlarged characteristic chart showing a part of FIG. 12.

FIG. 12 to FIG. 14 are characteristic charts showing pass characteristics obtained by the simulation. In FIG. 12 to FIG. 14, the horizontal axis indicates the frequency, and the vertical axis the attenuation. FIG. 13 shows a frequency range in the vicinity of the passband in an enlarged scale. FIG. 14 shows a frequency range near the upper cut-off frequency of the passband. In FIG. 12 to FIG. 14, the curve denoted by the reference numeral 91 indicates the pass characteristic of the structure model. The curve denoted by the reference numeral 92 indicates the pass characteristic of the circuit model.

As shown in FIG. 14, it can be seen that the structure model (reference numeral 91) changes sharply in the attenuation at the frequency range near the upper cut-off frequency, compared to the circuit model (reference numeral 92). The structure model is different from the circuit model in that the inductors L11 and L14 are configured to be magnetically coupled inside the stack 50. As can be seen from the simulation results, according to the present embodiment, a pass characteristic changing sharply at a frequency range near a cut-off frequency can be implemented by configuring the inductors L11 and L14 to be magnetically coupled inside the stack 50.

A pass characteristic changing sharply at a frequency range near a cut-off frequency can also be implemented by increasing the number of LC resonators. However, the greater the number of LC resonators, the more difficult the filter device is to downsize. By contrast, according to the present embodiment, the filter device 1 can be downsized since the foregoing pass characteristic can be implemented without increasing the number of LC resonators.

Next, other effects of the present embodiment will be described. In the present embodiment, the through hole lines T1 and T2 of the inductor L11 and the through hole lines T3 and T4 of the inductor L14 are located inside the stack 50, near the center of the stack 50 in the direction parallel to the Y direction. The inductor conductor layers 751 and 752 (761 and 762) are shaped to extend in the directions away from each other. In the present embodiment, components of the filter device 1 can thus be located on the bottom surface 50A side of the inductor conductor layers 751 and 752 (761 and 762). In the present embodiment, the inductor L12 is located on the bottom surface 50A side of the inductor conductor layer 751 (761), and the inductor L13 is located on the bottom surface 50A side of the inductor conductor layer 752 (762). According to the present embodiment, the space inside the stack 50 can thus be efficiently used to downsize the filter device 1.

Note that the present invention is not limited to the foregoing embodiment, and various modifications can be made thereto. For example, a filter device according to the present invention may only include either one of the LC resonators 12 and 13. Alternatively, one or more LC resonators may be provided between the LC resonators 11 and 12 or between the LC resonators 13 and 14.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A multilayered filter device comprising:
   a first port;
   a second port;
   a first LC resonator electrically connected to the first port;
   a second LC resonator electrically connected to the second port;
   a third LC resonator provided between the first LC resonator and the second LC resonator in a circuit configuration; and
   a stack that includes a plurality of dielectric layers stacked together, and that is configured to integrate the first port, the second port, the first LC resonator, the second LC resonator, and the third LC resonator, wherein
   the first LC resonator includes a first inductor that is electrically connected to the first port via a conductor and is not directly connected to a ground,
   the second LC resonator includes a second inductor that is electrically connected to the second port via a conductor and is not directly connected to the ground, and
   the first inductor and the second inductor are configured to be magnetically coupled inside the stack.

2. The multilayered filter device according to claim 1, wherein the first inductor and the second inductor adjoin inside the stack.

3. The multilayered filter device according to claim 1, wherein:
   the first inductor includes two first through hole lines and a first conductor layer connecting the two first through hole lines;
   the second inductor includes two second through hole lines and a second conductor layer connecting the two second through hole lines; and
   each of the two first through hole lines and the two second through hole lines is formed by connecting two or more through holes in series.

4. The multilayered filter device according to claim 3, wherein no conductor exists between the two first through hole lines and the two second through hole lines.

5. The multilayered filter device according to claim 3, wherein a first region sandwiched between the two first through hole lines and a second region sandwiched between the two second through hole lines overlap with each other when seen in a direction orthogonal to a stacking direction of the plurality of dielectric layers.

6. The multilayered filter device according to claim 3, wherein the first conductor layer and the second conductor layer do not overlap with each other when seen in a direction parallel to a stacking direction of the plurality of dielectric layers.

7. The multilayered filter device according to claim 3, wherein:
   the first conductor layer includes a portion that extends in a direction away from the second conductor layer; and
   the second conductor layer includes a portion that extends in a direction away from the first conductor layer.

8. The multilayered filter device according to claim 3, wherein:
   the third LC resonator includes a third inductor;
   the third inductor includes a third conductor layer; and
   the third conductor layer overlaps a region where the first conductor layer or the second conductor layer is located when seen in a direction parallel to a stacking direction of the plurality of dielectric layers.

9. The multilayered filter device according to claim 8, wherein:
   the stack has a first surface opposed to a body to be mounted, and a second surface opposite the first surface; and
   the third conductor layer is located between the first conductor layer or the second conductor layer and the first surface.

10. The multilayered filter device according to claim 1, wherein:
    each of the first LC resonator and the second LC resonator constitutes a low-pass filter; and
    the third LC resonator constitutes a high-pass filter.

* * * * *